United States Patent
Spyrison et al.

(10) Patent No.: US 11,966,520 B1
(45) Date of Patent: Apr. 23, 2024

(54) AMBIDEXTROUS MOUSE

(71) Applicant: TARGUS INTERNATIONAL LLC, Anaheim, CA (US)

(72) Inventors: Ben Spyrison, Norwalk, CA (US); Jonny Yuan, Placentia, CA (US); Daniel Ballou, Long Beach, CA (US); Joven De La Vega, Downey, CA (US)

(73) Assignee: Targus International LLC, Anaheim, CA (US)

( * ) Notice: Subject to any disclaimer, the term of this patent is extended or adjusted under 35 U.S.C. 154(b) by 0 days.

(21) Appl. No.: 18/055,812

(22) Filed: Nov. 15, 2022

(51) Int. Cl.
*G06F 3/0354* (2013.01)
*H03K 17/96* (2006.01)

(52) U.S. Cl.
CPC ......... *G06F 3/03543* (2013.01); *H03K 17/96* (2013.01); *G06F 2203/0332* (2013.01)

(58) Field of Classification Search
CPC ........ G06F 3/03543; G06F 2203/0332; H03K 17/96
See application file for complete search history.

(56) References Cited

U.S. PATENT DOCUMENTS

| | | | |
|---|---|---|---|
| 5,894,302 A * | 4/1999 | Scenna | G06F 3/03543 345/163 |
| 6,373,468 B1 * | 4/2002 | Leman | G06F 3/03543 345/163 |
| 7,030,857 B2 | 4/2006 | O'Keefe et al. | |
| 7,333,091 B2 | 2/2008 | Hou et al. | |
| 7,768,500 B2 | 8/2010 | Saez et al. | |
| 7,884,800 B2 | 2/2011 | Yuan et al. | |
| 8,432,359 B2 | 4/2013 | Hou et al. | |
| 8,537,115 B2 | 9/2013 | Hotelling et al. | |
| 8,704,770 B2 | 4/2014 | Hotelling et al. | |
| 9,471,157 B2 | 10/2016 | Li et al. | |
| 9,684,387 B2 | 6/2017 | Wang et al. | |
| 9,785,258 B2 | 10/2017 | Hotelling et al. | |
| 9,904,376 B2 | 2/2018 | Chao | |
| 10,042,441 B2 | 8/2018 | O'Mahony et al. | |
| 10,156,914 B2 | 12/2018 | Hotelling et al. | |
| 10,191,567 B2 | 1/2019 | Hong | |
| 10,324,541 B2 | 6/2019 | Lee | |
| 10,331,234 B2 | 6/2019 | Lu et al. | |
| 10,423,244 B2 | 9/2019 | Chiang | |
| 10,474,251 B2 | 11/2019 | Hotelling et al. | |
| 10,664,067 B2 | 5/2020 | Wang et al. | |

(Continued)

FOREIGN PATENT DOCUMENTS

| | | |
|---|---|---|
| TW | 111123299 | 6/2022 |
| WO | 2020142101 A1 | 7/2020 |

OTHER PUBLICATIONS

International Search Report and Written Opinion received for International PCT Application No. PCT/US2023/079544, dated Dec. 26, 2023, 10 pages.

*Primary Examiner* — Stephen G Sherman
*Assistant Examiner* — Joseph P Fox
(74) *Attorney, Agent, or Firm* — Stoel Rives LLP (57) ABSTRACT

Computer mice for ambidextrous use are disclosed. An example mouse includes a based and a cover. The base may mount one or more electronic devices for sensing. The cover may be coupled to the base in a first orientation relative to the base in a first mode, may be detached from the base, and may be coupled to the base in a second orientation reverse to the first orientation in a second mode.

16 Claims, 8 Drawing Sheets

(56) References Cited

U.S. PATENT DOCUMENTS

| | | |
|---|---|---|
| 10,877,579 B2 | 12/2020 | O'Mahony et al. |
| 2006/0146025 A1 | 7/2006 | O'Keefe et al. |
| 2007/0132733 A1* | 6/2007 | Ram .................. G06F 3/03544 |
| | | 345/163 |
| 2008/0174557 A1 | 7/2008 | Hou et al. |
| 2015/0286296 A1 | 10/2015 | Wang et al. |
| 2021/0389832 A1 | 12/2021 | Wu |

* cited by examiner

AMBIDEXTROUS MOUSE

BACKGROUND

This disclosure relates generally to input devices for electronic devices, such as computers, and, more specifically, to computer mice for ambidextrous use.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments. Thus, the following more detailed description of the embodiments of the systems, methods, and apparatuses is not intended to limit the scope of the disclosure, but is merely representative of possible embodiments of the disclosure. In some cases, well-known structures, materials, or operations are not shown or described in detail.

The present disclosure provides various embodiments of an input device, such as a computer mouse, for ambidextrous use. According to various embodiments, the computer mouse may include a base and a cover that may be securely coupled to the base in either a first orientation or a second orientation reverse to the first orientation relative to the base. In some embodiments, the base may have one or more buttons that are configured to be engaged to the cover at either a left side or a right side of the cover. The mouse may further include one more push-on switches that securely engage the one or more buttons to the cover at either the left side or the right side of the cover. Furthermore, in some embodiments, the cover may have a symmetrical shape with respect to a longitudinal axis. The base may include a thumb rest that has a shape that has a symmetrical shape with respect to a lateral axis. By including symmetrical components, such as the cover and the thumb rest, the computer mouse may provide symmetrical operability to left-handed users and right-handed users without extra components designated for either right-handed or left-handed users.

Figure 1:
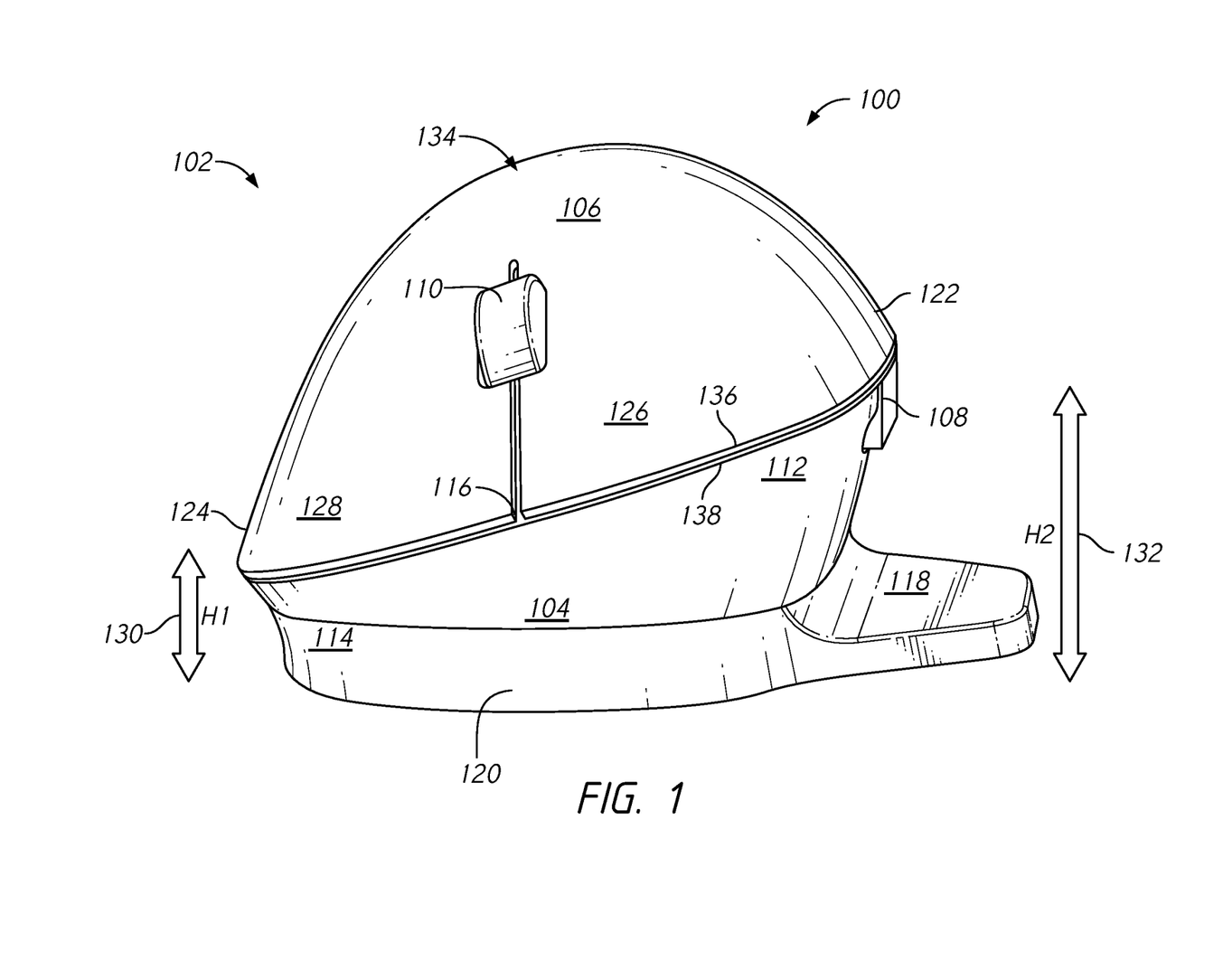
FIG. 1 is a front view of an exemplary input device according to an embodiment of the present disclosure.

FIG. 1 is a front view 100 of an exemplary input device 102 according to an embodiment of the present disclosure. In some embodiments, the input device 102 may be a mouse 102 in a first mode configured to be operated by a right hand. The mouse 102 may include a base 104 and a cover 106 coupled to the base 104. The base 104 may mount electronic devices (not shown), such as sensors and/or switches, a communication device, and a power supply device. Some of the sensors and/or switches may provide one or more input signals responsive to one or more actions of a user to control the mouse 102. The communication device may convert the one or more input signals into one or more communication signals to a remote device. The power supply device may supply power to the sensors and/or switches and communication devices. In some embodiments, the power supply device may be a battery configured to be stored in a battery case mounted on the base 104.

The base 104 may by shaped as, for example, a circle, an oval, a rectangle, or any other feasible shape, with at least one planar surface at the bottom of the base 104, in a manner that the base 104 may slide on a flat surface, such as a desk, a table, or a mouse pad, responsive to a force given by a user touching the mouse 102.

The cover 106 may be securely coupled to the base 104 while covering the electronic devices mounted on the base 104. In some embodiments, the mouse 102 may be configured to be operated by a right hand. The cover 106 may be attached to the base 104 in a first orientation in the first mode. The cover 106 has a contact perimeter 136 that is configured to match a contact perimeter 138 of the base 104. For example, a front end 116, a right side 124, and a left side 122 of the cover 106 may be coupled to a first end 120, an outer side 114, and an inner side 112 of the base 104, respectively. In some embodiments, the base 104 may also include one or more buttons 108 at the inner side 112. The one or more buttons 108 may be engaged to the cover 106 at one side, e.g., the left side 122, of the cover 106 in FIG. 1. In some embodiments, the base 104 may include a fin 118 at the inner side 112 that is coupled to the left side 122. In some embodiments, the fin 118 may be configured to be a thumb rest at the inner side 112 of the base 104 for a right-hand user. In some embodiments, at least a portion of the fin 118 at the inner side 112 of the base 104 may be outside the contact perimeter 138.

In some embodiments, the base 104 may have a top surface tilted in a manner that a height H2 132 of the top surface at the inner side 112 coupled to the left side 122 of the cover 106 is greater than a height H1 130 of the top surface at the outer side 114 coupled to the right side 124 of the cover 106. The greater height H2 132 of the top surface of the inner side 112 and the fin 118 may provide a thumb rest position for the right hand. In some embodiments, the cover 106 may have a spherical shape with a peak 134 away from the front end 116. An angle of the tilted top surface of the base 104 and the spherical shape of the cover 106 may correspond to a shape of fingers and a shape of a palm of a right hand that operates the mouse 102, respectively.

The mouse 102 may include a wheel 110, a left button 126, and a right button 128. The wheel 110 may be exposed through a top surface of the cover 106. The wheel 110 may be configured to convey a finger movement of a wheel turning action in front and back directions to a corresponding one of the sensors on the base 104. In some embodiments, the wheel turning action may corresponding to a scroll function of a pointer on a display of a computer device coupled to the mouse 102. The left button 126 and the right button 128 may be configured to convey a finger movement of a pressing action upon being pressed to corresponding switches on the base 104. The wheel 110 may also be configured to convey a finger movement of a pressing action being pressed to corresponding switches on the base 104. The mouse 102 may detect an action of a user, such as the finger movements described above, and a hand movement that may be sensed by a sensor, such as an optical sensor or a track ball sensor, on a bottom surface of the base 104. A direction and a speed of a hand movement of the mouse 102 may be translated into a direction and a speed of a pointer movement in the display. The pressing actions on the left button 126, the right button 128, and the wheel 110 may be interpreted as different actions, such as click, drag, drop, or swipe actions in the display, depending on an application, a location of the pointer in the display, and a duration of the user actions, together with the hand movement of the mouse 102.

Figure 2:
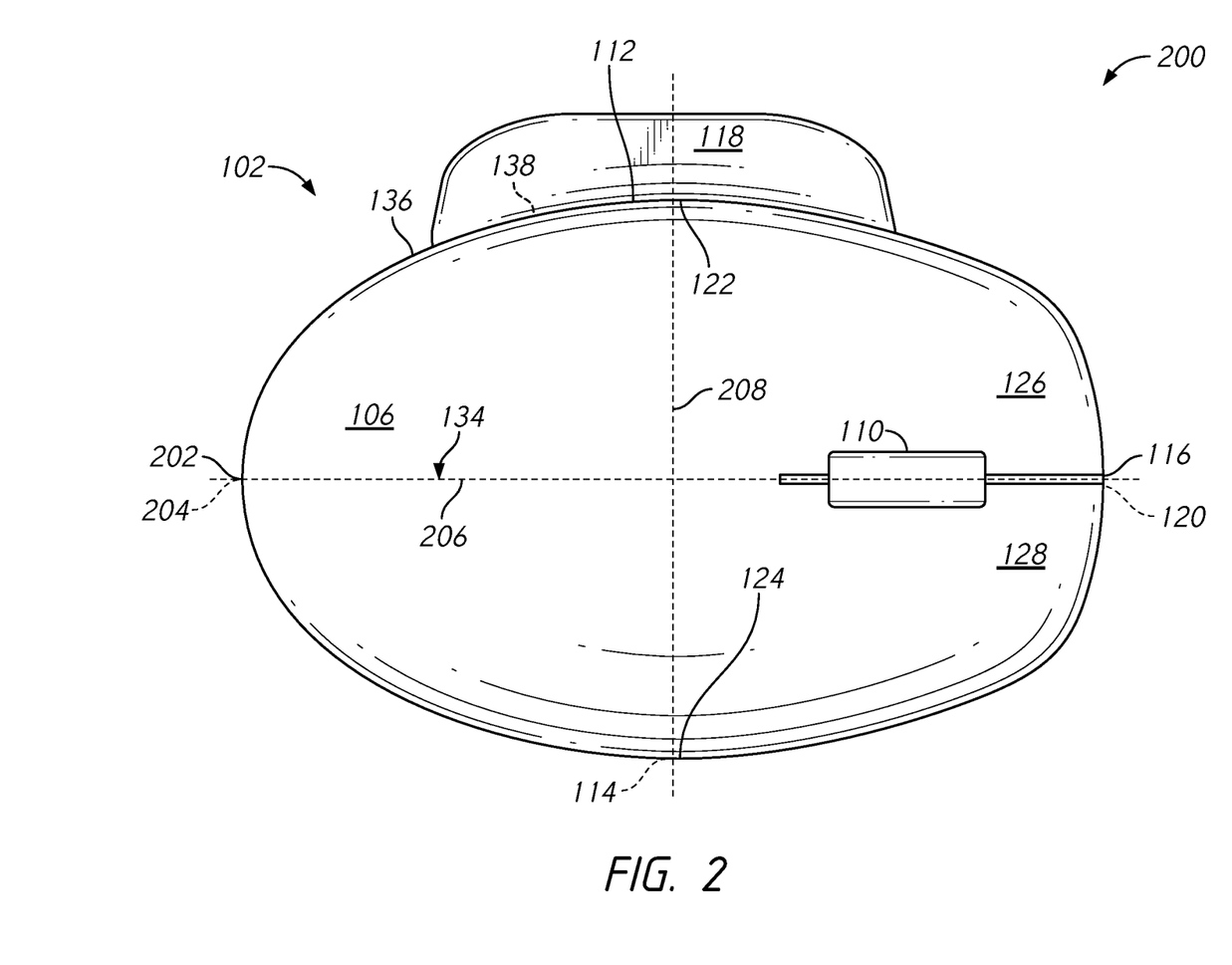
FIG. 2 is a top view of the exemplary input device according to the embodiment of the present disclosure.

FIG. 2 is a top view 200 of the exemplary input device 102 according to the embodiment of the present disclosure. In some embodiments, the input device 102 may be the mouse 102 of FIG. 1 in the first mode. The mouse 102 may include the cover 106, the base 104, the wheel 110, the fin 118, the left button 126, and the right button 128. A detailed description of functionalities of the cover 106, the base 104, the wheel 110, the fin 118, the left button 126, and the right button 128, which have been previously described referring to FIG. 1, is therefore not repeated herein for brevity.

The base 104 of the mouse 102 may include the first end 120, a second end 204, the outer side 114, and the inner side 112. The cover 106 may be securely coupled to the base 104 while covering the electronic devices mounted on the base 104. The contact perimeter 136 of the cover 106 is configured to match the contact perimeter 138 of the base 104. In some embodiments, the front end 116, the right side 124, the left side 122, and a back end 202 of the cover 106 may be coupled to the first end 120, the outer side 114, the inner side 112, and the second end 204 of the base 104, respectively.

The top view 200 shows a lateral axis 208 across the inner side 112 and the outer side 114. A shape of the base 104 viewed from the top may be symmetrical with respect to the lateral axis 208. A shape of the fin 118 viewed from the top may also be symmetrical with respect to the lateral axis 208.

The top view 200 shows a longitudinal axis 206 across the front end 116 and the back end 202. A shape of the cover 106 viewed from the top may be symmetrical with respect to the longitudinal axis 206. The right button 128 and the left button 126 may be symmetrically arranged with respect to the longitudinal axis 206. Shapes of the right button 128 and the left button 126 viewed from the top may also be symmetrical along the longitudinal axis 206.

In some embodiments, a shape of the cover 106 and the shape of the base 104 excluding the fin 118 in the top view 200 may be symmetrical with respect to the lateral axis 208 and the longitudinal axis 206. However, actual shapes of the cover 106 and the base 104 may not be symmetrical with respect to the lateral axis 208 and the longitudinal axis 206. For example, the base 104 under the cover 106 may have a tilted top surface as described with respect to FIG. 1. The cover 106 may have the peak 134 on the longitudinal axis 206 shifted from the lateral axis 208 towards the back end 202 that is coupled to the second end 204.

Figure 3:
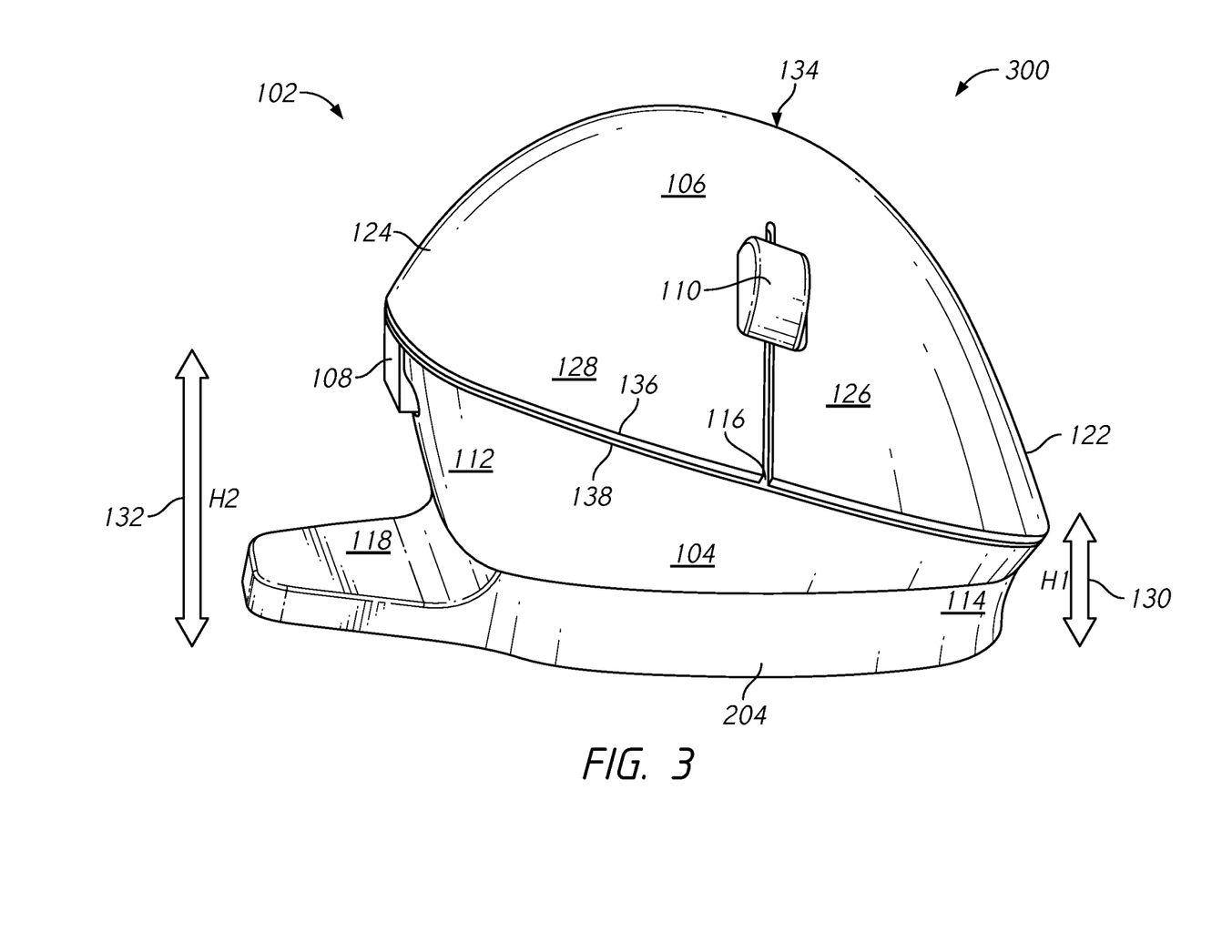
FIG. 3 is a front view of an exemplary input device according to an embodiment of the present disclosure.

FIG. 3 is a front view 300 of an exemplary input device 102 according to an embodiment of the present disclosure. In some embodiments, the input device 102 may be the mouse 102 of FIGS. 1 and 2, in a second mode configured to be operated by a left hand. The mouse 102 may include the cover 106, the base 104, the wheel 110, the fin 118, the left button 126, and the right button 128. A detailed description of structural configuration of each of the cover 106 and the base 104, and a detailed description of functionalities of the cover 106, the base 104, the wheel 110, the fin 118, the left button 126, and the right button 128, which have been previously described referring to FIGS. 1 and 2, are therefore not repeated herein for brevity.

The cover 106 may be securely coupled to the base 104 while covering the electronic devices mounted on the base 104. In some embodiments, the mouse 102 may be configured to be a mouse that is operated by a left hand. The cover 106 may be attached to the base 104 in a second orientation reverse to the first orientation of FIG. 1 in the second mode. For example, the front end 116, the right side 124, and the left side 122 of the cover 106 may be coupled to the second end 204, the inner side 112, and the outer side 114 of the base 104, respectively. The one or more buttons 108 at the inner side 112 may be engaged to the cover 106 at one side, e.g., the right side 124, of the cover 106 in FIG. 1. In some embodiments, the base 104 may include the fin 118 at the inner side 112 that is coupled to the right side 124. In some embodiments, the fin 118 may be configured to be a thumb rest at the inner side 112 of the base 104 for a left-handed user.

In some embodiments, the base 104 may have a top surface tilted in a manner that a height H2 132 of the top surface at the inner side 112 coupled to the left side 122 of the cover 106 is greater than a height H1 130 of the top surface at the outer side 114 coupled to the right side 124 of the cover 106. The greater height H2 132 of the top surface of the inner side 112 and the fin 118 may provide a thumb rest position for the left hand. In some embodiments, the cover 106 may have the spherical shape with a peak 134 away from the front end 116. An angle of the tilted top surface of the base 104 and the spherical shape of the cover 106 may correspond to a shape of fingers and a shape of a palm of a left hand that operates the mouse 102, respectively.

Figure 4:
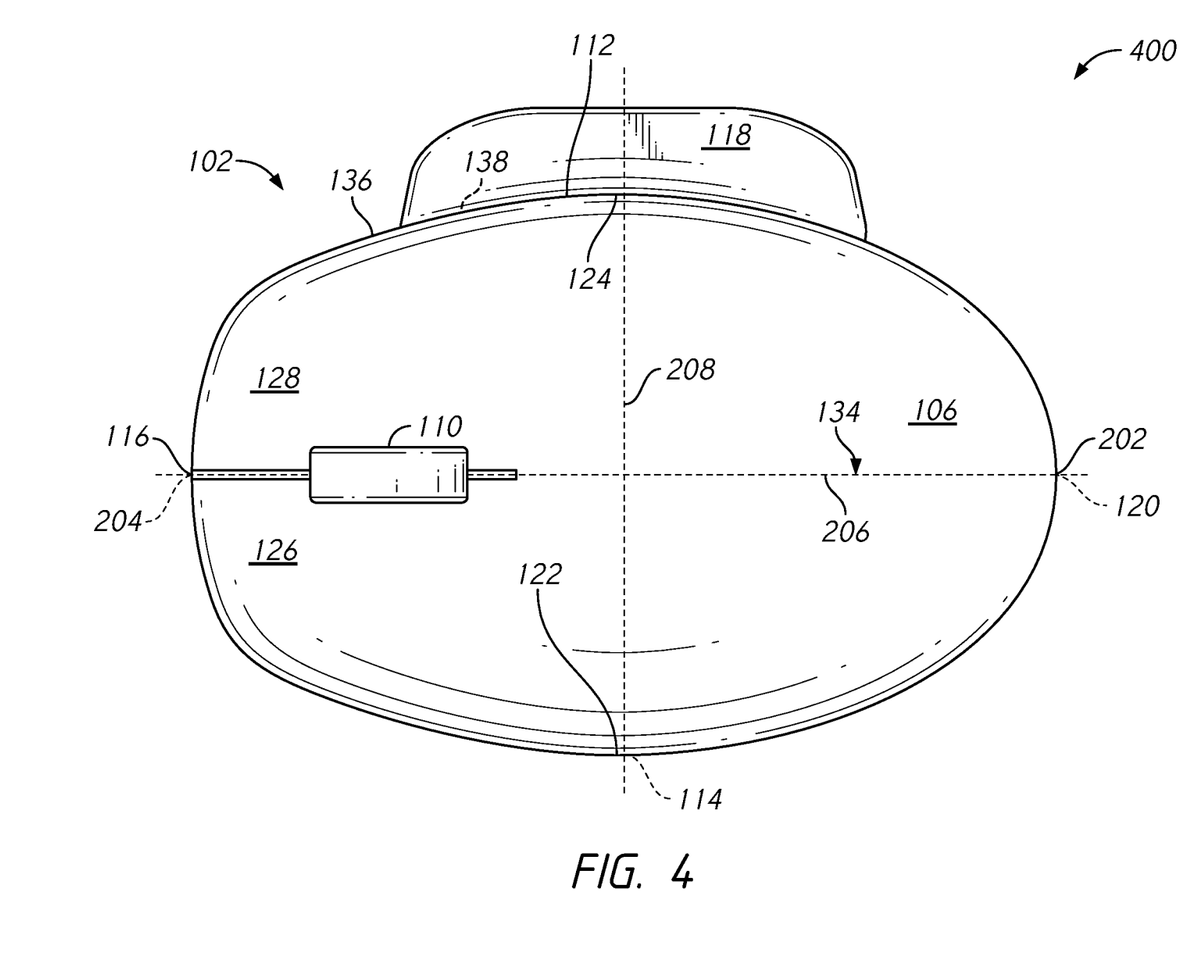
FIG. 4 is a top view of the exemplary input device according to the embodiment of the present disclosure.

FIG. 4 is a top view 400 of the exemplary input device 102 according to the embodiment of the present disclosure. In some embodiments, the input device 102 may be the mouse 102 of FIGS. 1-3 in the second mode. The mouse 102 may include the cover 106, the base 104, the wheel 110, the fin 118, the left button 126, and the right button 128. A detailed description of functionalities of the cover 106, the base 104, the wheel 110, the fin 118, the left button 126, and the right button 128, which have been previously described referring to FIGS. 1-3, is therefore not repeated herein for brevity.

The cover 106 may be securely coupled to the base 104 while covering the electronic devices mounted on the base 104. In some embodiments, the front end 116, the right side 124, the left side 122, and the back end 202 of the cover 106 may be coupled to the second end 204, the inner side 112, the outer side 114, and the first end 120 of the base 104, respectively.

The top view 400 shows the lateral axis 208 across the inner side 112 and the outer side 114. The shape of the base 104 viewed from the top may be symmetrical with respect to the lateral axis 208. The shape of the fin 118 viewed from the top may also be symmetrical with respect to the lateral axis 208.

The top view 400 shows the longitudinal axis 206 across the front end 116 and the back end 202. The shape of the cover 106 viewed from the top may be symmetrical with respect to the longitudinal axis 206. The right button 128 and the left button 126 may be symmetrically arranged with respect to the longitudinal axis 206. Shapes of the right button 128 and the left button 126 viewed from the top may also be symmetrical along the longitudinal axis 206.

In some embodiments, a shape of the cover 106 and the shape of the base 104 excluding the fin 118 in the top view 400 may be symmetrical with respect to the lateral axis 208 and the longitudinal axis 206. However, actual shapes of the cover 106 and the base 104 may not be symmetrical with respect to the lateral axis 208 and the longitudinal axis 206. For example, the base 104 under the cover 106 may have a tilted top surface as described with respect to FIG. 3. The cover 106 may have the peak 134 on the longitudinal axis 206 shifted from the lateral axis 208 towards the back end 202 that is coupled to the first end 120.

The cover 106 of the mouse 102 may be detached from the base 104 to change an orientation of the mouse 102, and may be reattached to the base 104 in a manner that the mouse 102 can be used by right-hand users and left-hand users. An exemplary procedure of changing a configuration of the mouse 102 from a right-hand use to a left-hand use will be described with reference to FIGS. 5-8.

Figure 5:
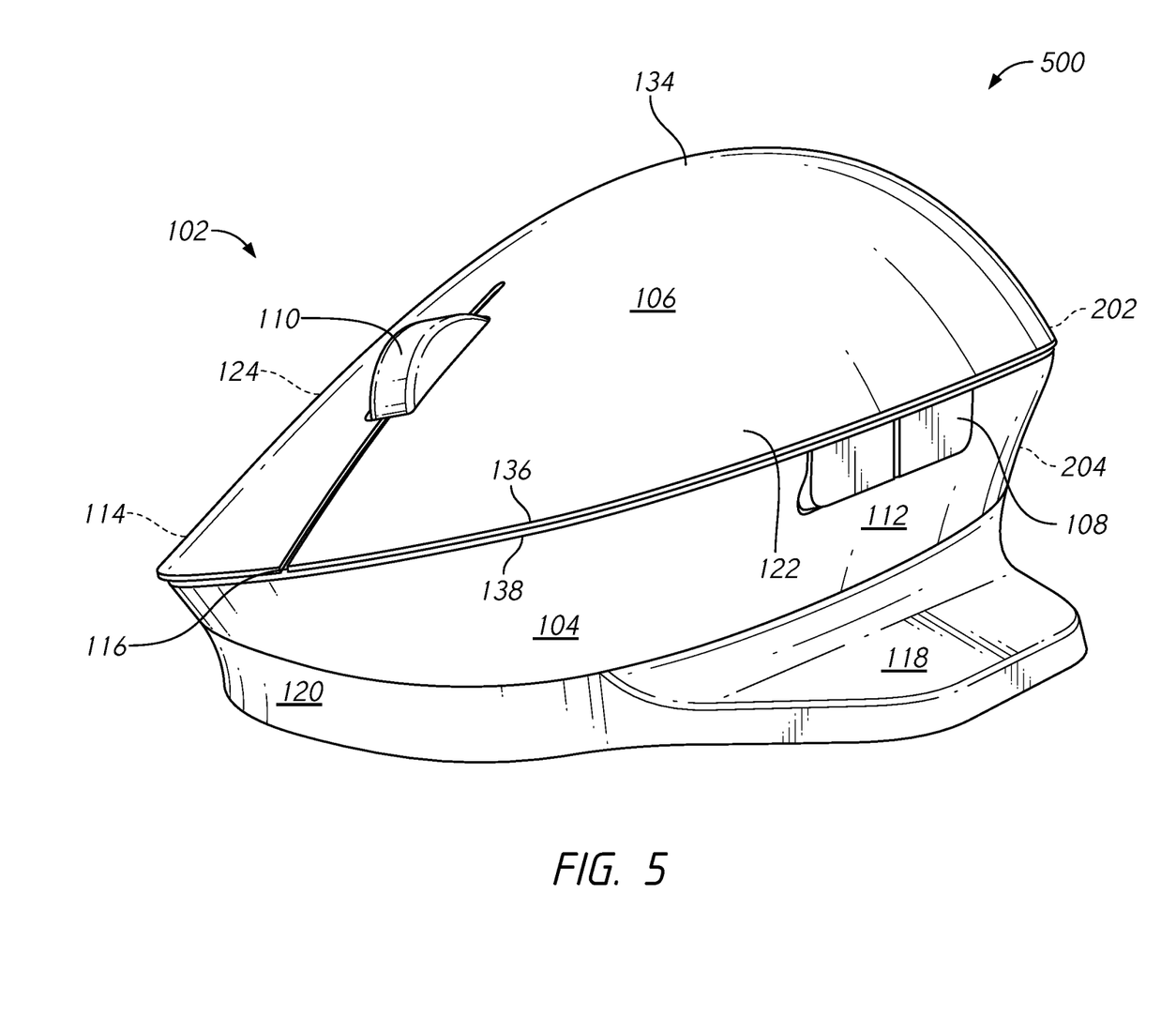
FIG. 5 is a perspective view of an exemplary input device according to an embodiment of the present disclosure.

FIG. 5 is a perspective view 500 of an exemplary input device 102 according to an embodiment of the present disclosure. In some embodiments, the input device 102 may be the mouse 102 of FIGS. 1 and 2. The mouse 102 may include the cover 106, the base 104, the wheel 110, the fin 118, the left button 126, and the right button 128. A detailed description of functionalities of the cover 106, the base 104, the wheel 110, the fin 118, the left button 126, and the right button 128, which have been previously described referring to FIG. 1, is therefore not repeated for description of FIGS. 5-8 for brevity.

In FIG. 5, the cover 106 may be securely coupled to the base 104 while covering the electronic devices mounted on the base 104. In some embodiments, the mouse 102 may be configured to be a mouse that is operated by a right hand. For example, the front end 116, the right side 124, the left side 122, and the back end 202 of the cover 106 may be coupled to the first end 120, the outer side 114, the inner side 112, and the second end 204 of the base 104, respectively. In some embodiments, the cover 106 may have a spherical shape with the peak 134 away from the front end 116, closer to the back end 202 attached to the second end 204. The spherical shape of the cover 106 may correspond to a shape of a palm of a right hand that operates the mouse 102, respectively.

In some embodiments, the base 104 may also include the one or more buttons 108 at the inner side 112. The one or more buttons 108 may be engaged to the cover 106 at one side, e.g., the left side 122, of the cover 106 in FIG. 1. When the one or more buttons 108 are pressed, the buttons 108 may disengage the cover 106 from the base 104.

Figure 6:
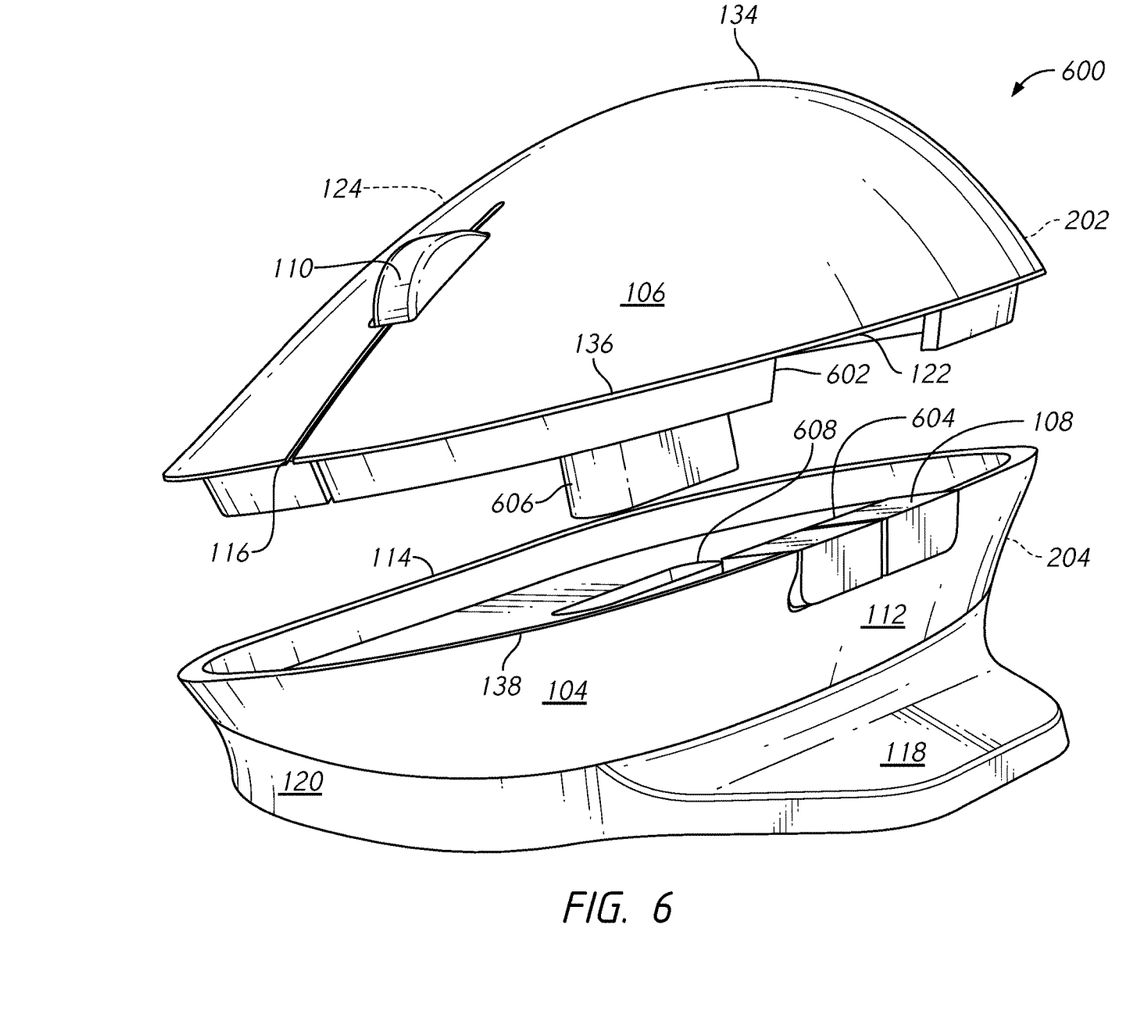
FIG. 6 is an exploded view of the exemplary input device according to an embodiment of the present disclosure.

FIG. 6 is an exploded view 600 of the exemplary input device 102 according to the embodiment of the present disclosure. The cover 106 may include a convex portion 606. The base 104 may include an opening 608 on the top surface. When the cover 106 is being attached to the base 104, the convex portion 606 may be inserted into the opening 608. The opening 608 may receive the convex portion 606. In some embodiments, a shape of the opening 608 may be slightly larger than a cross-section of the convex portion 606; thus the convex portion 606 may fit in the opening 608 in a stable manner, when the cover 106 is attached to the base 104. In some embodiments, shapes of the convex portion 606 and the opening 608 may be symmetrical with respect to the lateral axis 208 and the longitudinal axis 206. Furthermore, the convex portion 606 and the opening 608 may store sensors, such as an optical sensor or a track ball sensor, to be exposed on the bottom surface of the base 104.

In some embodiments, the base 104 may include the one or more buttons 108 at the inner side 112 and one or more switches 604. For example, the one or more switches 604 may be push-on switches. The cover 106 may have a cutout (left) 602 at the left side 122. When the cover 106 is securely attached to the base 104 as shown in FIG. 5, the one or more switches 604 may engage the one or more buttons 108 to edges of the cutout (left) 602 of the cover 106. When the one or more buttons 108 are pressed, the one or more switches 604 may release the one or more buttons 108 from the edges of the cutout (left) 602 of the cover 106. Thus, the cover 106 may be released from the base 104.

Figure 7:
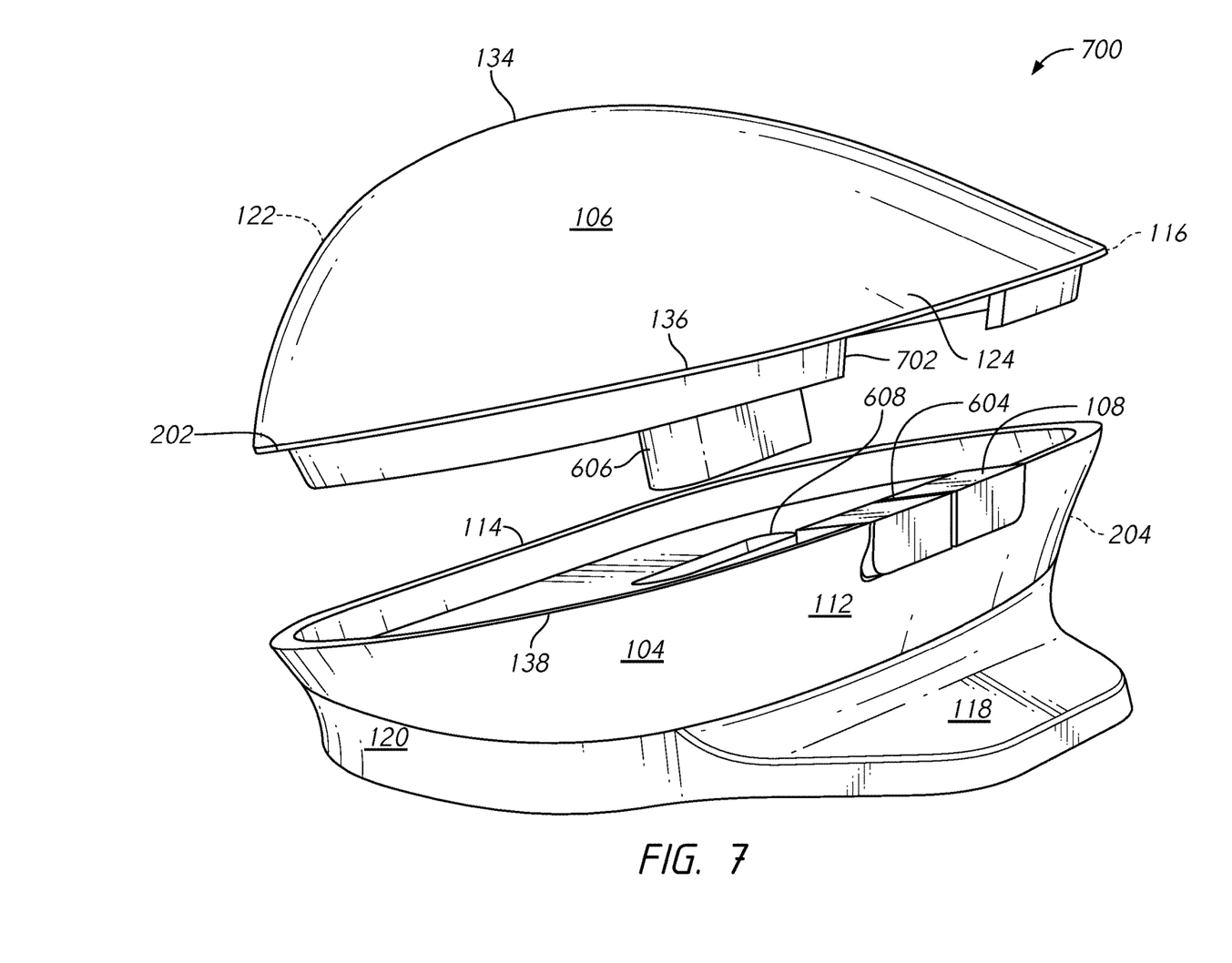
FIG. 7 is an exploded view of an exemplary input device according to an embodiment of the present disclosure.

FIG. 7 is an exploded view 700 of an exemplary input device according to an embodiment of the present disclosure. As shown in FIG. 7, an orientation of the cover 106 may be reversed. The front end 116, the right side 124, the left side 122, and the back end 202 of the cover 106 may be aligned above the second end 204, the inner side 112, the outer side 114, and the first end 120 of the base 104, respectively.

The cover 106 may have another cutout (right) 702 at the right side 124. In some embodiments, a shape of the cutout (right) 702 may be the same as a shape of the cutout (left) 602 to fit the one or more buttons 108. The location of the cutout (right) 702 may be symmetrical to the location of the cutout (left) 602 with respect to the longitudinal axis 206 of FIGS. 2 and 4. While the cover 106 is being detached from the base 104, the one or more buttons 108 are being released from edges of the cutout (right) 702 of the cover 106.

The convex portion 606 above the opening 608 may be inserted into the opening 608 when the cover 106 is being attached to the base 104. The one or more switches 604 may engage the one or more buttons 108 to edges of the cutout (right) 702 of the cover 106. Thus, the cover 106 may be securely attached to the base 104 as shown in FIG. 8.

Figure 8:
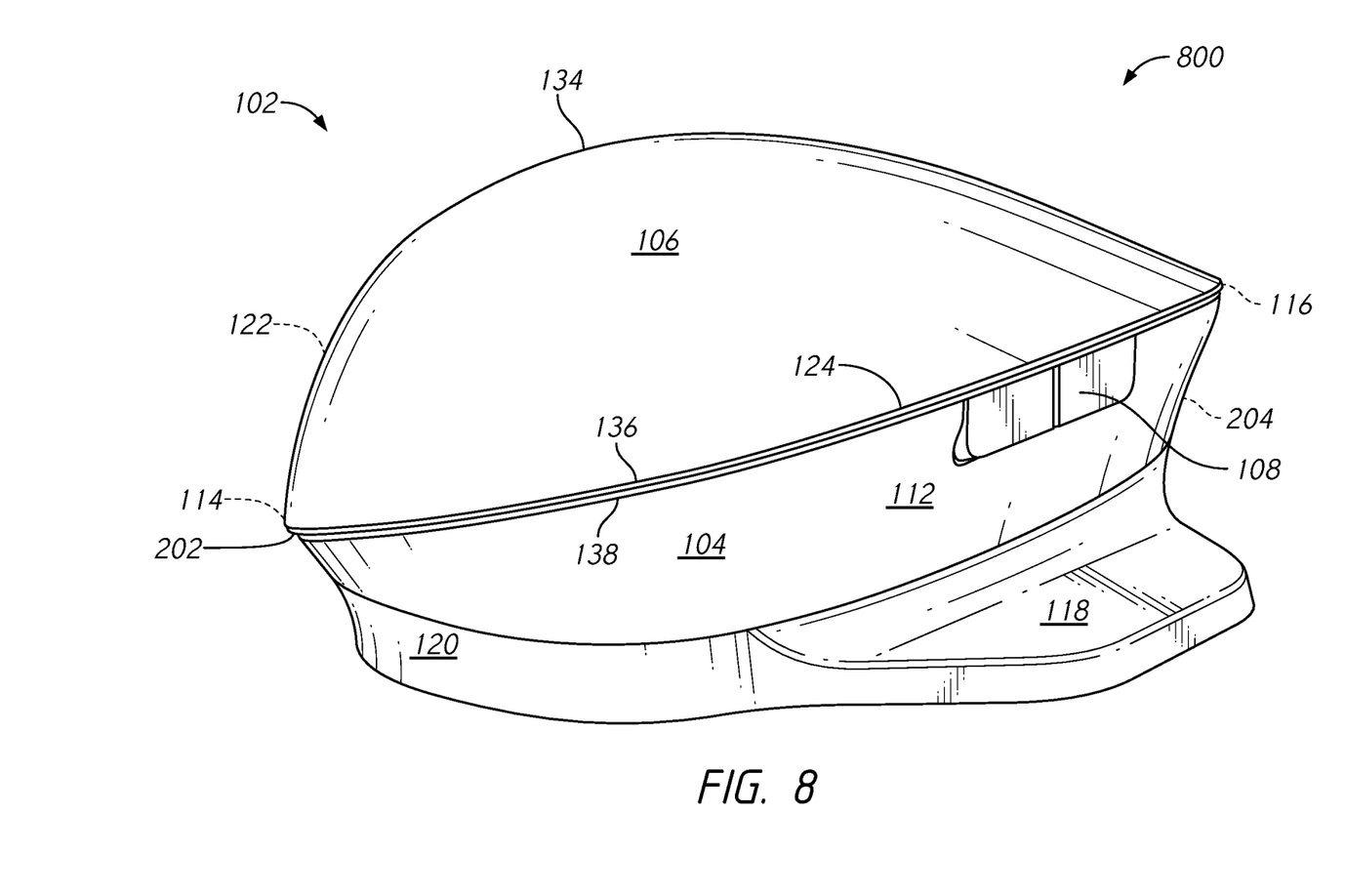
FIG. 8 is a perspective view of the exemplary input device according to the embodiment of the present disclosure.

FIG. 8 is a perspective view 800 of the exemplary input device 102 according to the embodiment of the present disclosure. In FIG. 8, the cover 106 may be securely coupled to the base 104 while covering the electronic devices mounted on the base 104. In some embodiments, the mouse 102 may be configured to be operated by a left hand. The cover 106 may be coupled to the base 104 in an opposite (e.g., reverse) orientation from the orientation of a mouse configured to be operated by a right hand. For example, the front end 116, the right side 124, the left side 122, and the back end 202 of the cover 106 may be coupled to the second end 204, the outer side 114, the inner side 112, and the first end 120 of the base 104, respectively. In some embodiments, the cover 106 may have a spherical shape with the peak 134 away from the front end 116, closer to the back end 202 attached to the first end 120. The spherical shape of the cover 106 may correspond to a shape of a palm of a left hand that operates the mouse 102, respectively.

In some embodiments, the one or more buttons 108 may be engaged to the cover 106 at one side, e.g., the right side 124, of the cover 106 in FIG. 1. When the one or more buttons 108 are pressed, the one or more buttons 108 may disengage the cover 106 from the base 104.

As described above, a mouse including a base and a cover that may be coupled to the base in a first orientation relative to the base, detached from the base, and further coupled to the base in a second orientation reverse to the first orientation may provide symmetric operability of the mouse when operated by a right hand or a left hand by switching the orientation of the cover relative to the base when coupling the cover to the base.

In the manner described above, embodiments of an input device, such as a mouse, including a base and a cover that is releasably coupled to the base, have been described above. A mouse including a base and a cover that may be coupled to the base in different orientations may provide symmetrical operability to right-handed users and left-handed users without extra components or parts specifically designed for either right-handed users or left-handed users.

Disclosed herein are various exemplary embodiments for an input device, such as a mouse for ambidextrous use. As can be appreciated by one of skill in the art, any one or more of the features, functions, and structure provided in one embodiment can be utilized in another disclosed embodiment. Thus many, if not all, of the features, functions, and structure are interchangeable with the disclosed embodiments.

This disclosure has been made with reference to various exemplary embodiments, including the best mode. However, those skilled in the art will recognize that changes and modifications may be made to the exemplary embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

This disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element. The scope of the present disclosure should, therefore, be determined by the following claims.

What is claimed is:

1. A mouse comprising:
a base configured to mount one or more electronic devices for sensing; and
a cover configured to be coupled to the base in a first orientation relative to the base in a first mode,
wherein the cover has a symmetrical shape with respect to a longitudinal axis of the mouse,
wherein the cover is configured to be detached from the base, and further configured to be coupled to the base in a second orientation reverse to the first orientation in a second mode, and
wherein the cover comprises a contact perimeter that is configured to match a contact perimeter of the base when the cover is coupled to the base.

2. The mouse of claim 1, wherein the base has a first end and a second end,
wherein the cover has a front end and a back end,
wherein the cover is configured to be releasably secured to the base by coupling the first end and the second end to the front end and the back end respectively in the first mode, and
wherein the cover is further configured to be releasably secured to the base by coupling the first end and the second end to the back end and the front end respectively in the second mode.

3. The mouse of claim 1, wherein the base comprises a thumb rest at a side.

4. The mouse of claim 3, wherein the thumb rest has a symmetrical shape with respect to a lateral axis of the mouse.

5. The mouse of claim 1, wherein the base comprises one or more buttons configured to be engaged to the cover.

6. The mouse of claim 5, wherein the one or more buttons are configured to be engaged to the cover at a first side of the cover in the first mode, and further configured to be engaged to the cover at a second side of the cover that is opposite to the first side of the cover in the second mode.

7. The mouse of claim 5, further comprising one or more switches configured to engage the one or more buttons to the cover.

8. A mouse comprising:
a base configured to mount one or more electronic devices for sensing, the base comprising an inner side, an outer side, and one or more buttons at the inner side; and
a cover configured to be attached to the base, the cover having a right side and a left side,
wherein the cover comprises a convex portion,
wherein the base comprises an opening configured to receive the convex portion,
wherein the convex portion and the opening are configured to store one or more sensors exposed on a bottom surface of the base,
wherein the right side and the left side are configured to be coupled to the outer side and the inner side respectively, and the one or more buttons are configured to be engaged to the cover at the left side of the cover, and
wherein the right side and the left side are further configured to be coupled to the inner side and the outer side respectively, and the one or more buttons are further configured to be engaged to the cover at the right side of the cover.

9. The mouse of claim 8, further comprising one or more switches configured to engage the one or more buttons to secure the cover to the base,
wherein the one or more switches are configured to engage the one or more buttons to the right side of the cover, and further configured to engage the one or more buttons to the left side of the cover.

10. The mouse of claim 8, wherein the opening is larger than a cross-section of the convex portion to fit the convex portion in the opening.

11. The mouse of claim 10, wherein shapes of the cross-section of the convex portion and the opening are symmetrical with respect to a lateral axis and a longitudinal axis of the mouse.

12. The mouse of claim 8, wherein the one or more sensors include at least one of an optical sensor or a track ball sensor.

13. A mouse comprising:
a base having an inner side, an outer side, a lateral axis across the inner and outer sides, and a contact perimeter configured to be coupled to a contact perimeter of a cover,
wherein the base comprises a top surface having a first height at the inner side and a second height at the outer side, and
wherein the first height is greater than the second height; and a thumb rest at the inner side of the base outside the contact perimeter,
wherein the thumb rest is configured to be a thumb rest for a right hand in a first mode and further configured to be a thumb rest for a left hand in a second mode.

14. The mouse of claim 13, wherein the thumb rest has a symmetrical shape with respect to the lateral axis.

15. The mouse of claim 13, further comprising a cover having a right side and a left side configured to be coupled to the outer side and the inner side of the base respectively in the first mode, and
wherein the right side and the left side are further configured to be coupled to the inner side and the outer side respectively in the second mode.

16. The mouse of claim 15, wherein the cover has a spherical shape having a peak away from a front end of the cover.

\* \* \* \* \*